(12) United States Patent
Wang

(10) Patent No.: US 10,712,931 B2
(45) Date of Patent: Jul. 14, 2020

(54) SYSTEMS FOR MODIFYING FINGER SENSATIONS DURING FINGER PRESS INPUT EVENTS

(71) Applicant: Apple Inc., Cupertino, CA (US)

(72) Inventor: Paul X. Wang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/038,544

(22) Filed: Jul. 18, 2018

(65) Prior Publication Data

US 2019/0065024 A1   Feb. 28, 2019

Related U.S. Application Data

(60) Provisional application No. 62/551,725, filed on Aug. 29, 2017.

(51) Int. Cl.
| | | |
|---|---|---|
| *G06F 3/01* | (2006.01) | |
| *G06F 3/0488* | (2013.01) | |
| *H03K 17/95* | (2006.01) | |
| *G06F 3/044* | (2006.01) | |
| *G06F 3/0354* | (2013.01) | |
| *H03K 17/96* | (2006.01) | |

(52) U.S. Cl.
CPC ............ *G06F 3/0488* (2013.01); *G06F 3/014* (2013.01); *G06F 3/016* (2013.01); *G06F 3/03547* (2013.01); *G06F 3/044* (2013.01); *G06F 3/04886* (2013.01); *H03K 17/952* (2013.01); *H03K 17/962* (2013.01); *H03K 17/9627* (2013.01); *G06F 2203/014* (2013.01); *G06F 2203/0331* (2013.01); *H03K 2217/96062* (2013.01)

(58) Field of Classification Search
None
See application file for complete search history.

(56) References Cited

U.S. PATENT DOCUMENTS

| | | |
|---|---|---|
| 5,631,861 A | 5/1997 | Kramer |
| 9,104,271 B1 | 8/2015 | Adams et al. |
| 9,110,505 B2 | 8/2015 | Mastandrea |
| 9,342,151 B2 | 5/2016 | Gu |

(Continued)

FOREIGN PATENT DOCUMENTS

WO   2016134295 A1   8/2016

*Primary Examiner* — Joseph R Haley
(74) *Attorney, Agent, or Firm* — Treyz Law Group, P.C.; G. Victor Treyz; David K. Cole

(57) ABSTRACT

A user may provide finger press input to a surface such as a touch sensitive input surface. The input surface may be formed from a two-dimensional touch sensor overlapping a display of an electronic device. The electronic device and an associated device such as a finger-mounted device may form a system for gathering the finger press input from the user. A sensor may be used in monitoring when the finger-mounted device and a user's finger in the device approach the input surface of the electronic device. In response to detection of the finger near the input surface, actuators in the finger-mounted device may squeeze the finger inwardly to cause a finger pad on the finger to protrude outwardly towards the input surface, thereby softening impact between the finger and the input surface. The electronic device may also have an array of components to repel the finger-mounted device.

18 Claims, 9 Drawing Sheets

(56) References Cited

U.S. PATENT DOCUMENTS

| | | |
|---|---|---|
| 9,612,664 B2 | 4/2017 | Croisonnier |
| 9,652,038 B2 | 5/2017 | Osman |
| 2013/0154813 A1* | 6/2013 | Gosline .................. G09B 23/28 |
| | | 340/407.2 |
| 2014/0139422 A1 | 5/2014 | Mistry et al. |
| 2014/0176452 A1* | 6/2014 | Aleksov ................ G06F 3/0412 |
| | | 345/173 |
| 2014/0267167 A1* | 9/2014 | Ricks ...................... G06F 3/041 |
| | | 345/175 |
| 2015/0153950 A1 | 6/2015 | Chang et al. |
| 2015/0205357 A1* | 7/2015 | Virtanen ................. G06F 3/041 |
| | | 340/407.2 |
| 2017/0168630 A1* | 6/2017 | Khoshkava ............. G06F 1/163 |
| 2017/0255265 A1* | 9/2017 | Dandamudi ............ H04W 4/80 |

\* cited by examiner

SYSTEMS FOR MODIFYING FINGER SENSATIONS DURING FINGER PRESS INPUT EVENTS

This application claims the benefit of provisional patent application No. 62/551,725, filed Aug. 29, 2017, which is hereby incorporated by reference herein in its entirety.

FIELD

This relates generally to electronic devices, and, more particularly, to input-output components for electronic devices.

BACKGROUND

Electronic equipment sometimes include touch sensitive components for gathering user input. For example, devices such as tablet computers and cellular telephones include touch-sensitive displays that can be used to display selectable menu options and virtual keyboards. With this type of input arrangement, a user's fingers may be used to provide input to a device.

The surfaces of touch sensitive displays are generally rigid. As a result, a user's finger motion will be abruptly halted upon contact with a display surface. If care is not taken, finger impact events may be jarring and fatiguing.

SUMMARY

A user may provide finger press input to a touch sensitive input surface or other input surface. The input surface may be formed from a two-dimensional touch sensor overlapping a display of an electronic device. The electronic device and associated equipment such as a finger-mounted device may form a system for gathering the finger press input from the user.

A sensor such as an optical proximity sensor or capacitive proximity sensor may be used in monitoring when the finger-mounted device and a user's finger in the device approach the input surface of the electronic device. In response to detection of motion of the finger towards the input surface, actuators in the finger-mounted device may squeeze the finger inwardly. This causes a finger pad portion of the finger to protrude outwardly towards the input surface, thereby softening impact between the finger and the input surface.

The electronic device may also have an array of components that repel the finger-mounted device and/or the finger in response to detection of the motion of the finger towards the input surface. These components may produce repulsive force using electrostatics, magnetic repulsion or attraction, ultrasonic output, and mechanical output. The components may, as an example, include an array of electromagnetics overlapping the input surface that magnetically repel a component such as a permanent magnet in the finger-mounted device.

DETAILED DESCRIPTION

Electronic equipment such as cellular telephones, tablet computers, embedded systems, and other equipment may include touch sensitive input devices. For example, electronic devices may include touch sensitive displays. A user may supply user input to a touch sensitive display using one or more fingers. In some situations, finger swipes and other gestures may be provided as input. In other situations, a user's fingers may strike the surface of a touch sensitive display in a direction that is normal to the surface. This type of finger press input (sometimes referred to as finger stroke input, keystroke input, virtual keyboard input, or virtual button input) may be used, for example, when a user is typing on a virtual keyboard. Virtual keyboards may be formed on touch sensitive displays by displaying key icons on the display and capturing respective touch sensor input. If desired, input surfaces such as virtual keyboards can be formed on other structures (e.g., table tops, vehicle dashboards, refrigerators, etc.). For example, finger press input may be gathered form an input surface onto which key icons have been projected using a projector and/or finger press input may be gathered from an input surface without any visible key icons. Configurations in which finger press input is gathered using two-dimensional touch sensors overlapping displays are sometimes described herein as examples.

To lessen fatigue and improve a user's experience when providing finger press input, the forces imposed on a user's fingers as the user is providing input to an electronic device can be modified using components coupled to a user's finger and/or components in the electronic device. As an example, components in a finger-mounted device and/or in a device with a touch sensitive input surface may be used to help soften the impact between a user's finger and the input surface.

An unmodified finger impact event may be characterized by an abrupt force-versus-displacement profile (e.g., rapidly rising force on a user's finger when traveling a relatively short distance toward an input surface). By modifying these forces, a user may be provided with softer finger-to-input-surface interactions, with finger sensations that mimic the action of clicking on a physical button, and/or other finger sensations.

Figure 1:
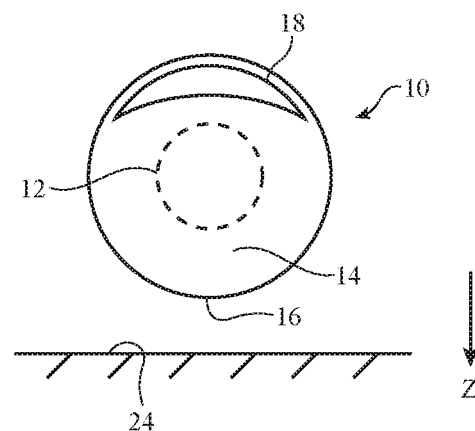
FIGS. 1, 2, and 3 are diagrams showing how a finger may impact a touch sensitive surface of a conventional electronic device.
Figure 2:
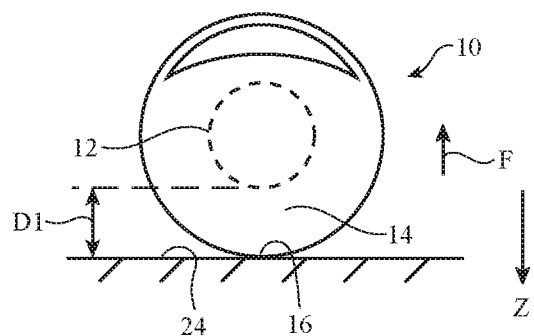
Figure 3:
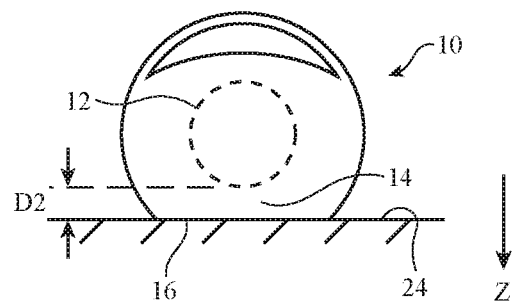

The way in which a user's finger interacts with a conventional input surface is illustrated in connection with FIGS. 1, 2, and 3. As shown in FIG. 1, a user's finger such as finger 10 includes finger bone 12. Fingernail 18 lies on the upper surface of finger 10. The opposing lower portion of finger 10 has finger pulp 14. Finger pulp 14 is located between bone 12 and finger pad 16 on the lower surface of finger 10.

In the scenario of FIG. 1, finger 10 is moving towards input surface 24, but finger pad 16 is not yet in contact with input surface 24. As a result, there is no force imposed on finger pad 16 and the user will not feel any sensation of contact with surface 24. As the user moves finger 10 in the +Z direction towards surface 24, finger pad 16 comes into contact with surface 24, as shown in FIG. 2. As soon as finger pad 16 contacts surface 24, further movement of finger 10 in the +Z direction will generate a resisting force F against surface 16 in the −Z direction due to compression of finger pulp 14 between bone 12 and finger pad 16.

When finger pad 16 initially contacts surface 24, bone 12 is at distance D1 from surface 24. As finger 10 is moved further in the +Z direction towards surface 24, finger pump 14 will be compressed and will flatten while expending laterally (to the left and right in the present example). When finger pulp 14 is fully compressed, finger 10 will come to rest against surface 24 and further motion of finger 10 in the +Z direction will be prevented. As shown in FIG. 3, bone 12 will be separated by a distance D2 that is less than D1 when finger pulp 14 has been fully compressed.

The process of arresting downward motion of finger 10 in this way can be abrupt. To reduce the abruptness of finger impacts against an input surface, the user's finger and/or an electronic device associated with input surface 24 may be provided with components that help soften the impact of the user's finger with surface 24 and/or that otherwise control user finger motion and user finger sensations during finger press events.

Figure 4:
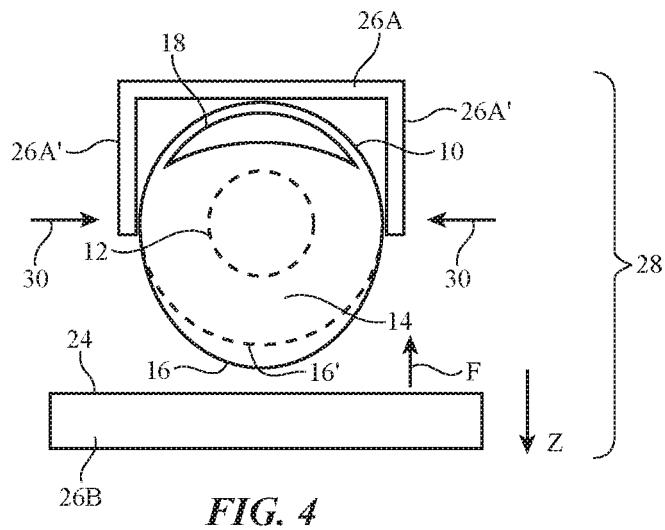
FIGS. 4, 5, and 6 are diagrams showing how a finger may contact an input surface such as a touch sensitive input surface in an electronic device in a system in accordance with an embodiment.
Figure 5:
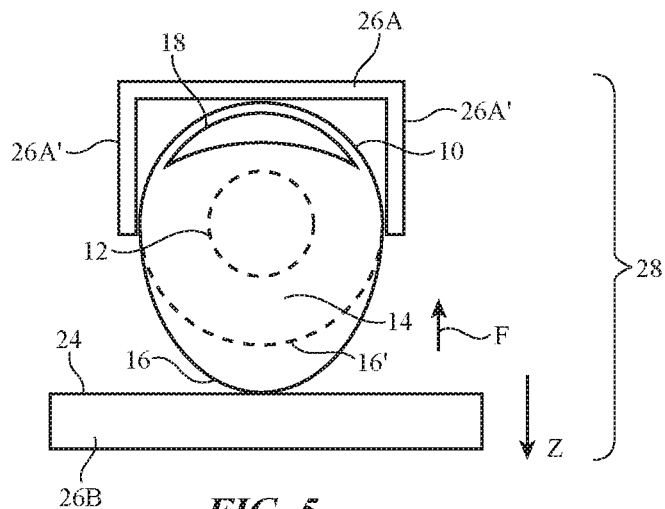
Figure 6:
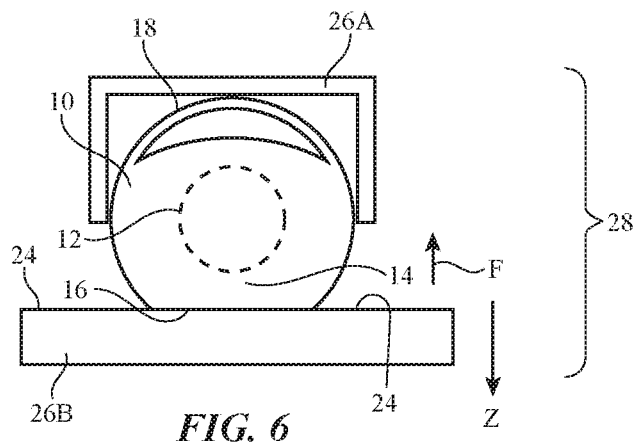

Consider, as an example, the system arrangement of FIGS. 4, 5, and 6. In this arrangement, finger 10 is being used to provide user input in system 28. System 28 includes finger-mounted device 26A and electronic device 26B. Electronic device 26B may have a touch screen, touch pad, or other input device(s) forming input surface 24. A user of system 28 may supply finger press input by pressing finger 10 against one or more regions of input surface 24 of device 26B (e.g., one or more regions associated with touch sensors on a touch sensitive display in device 26B or other sensors in device 26B). In this example, finger press input is gathered by device 26B. If desired, finger press input for system 28 may be gathered by detecting finger press events using an accelerometer or other sensor in device 26A (e.g., a sensor that detects finger press events due to abrupt changes in acceleration, a sensor that detects finger press events via compression of a dome switch, a touch or force sensor, etc.).

With the arrangement of FIGS. 4, 5, and 6, finger-mounted device 26A may interact with finger 10 to control force F during finger press events. Device 26A may have a body (housing) formed from metal, plastic, glass, ceramic, and/or other materials that is configured to be worn on the fingertip of finger 10. Device 26A may include a sensor in the body that determines when device 26A is approaching input surface 24 of device 26B and actuators that move side portions 26A' inwardly in directions 30 as finger 10 approaches input surface 24, as shown in FIG. 4. This squeezes side portions of finger pulp 14 inwardly from the left and right and forces remaining portions of finger pulp 14 to expand downwardly. As a result, finger pad 16 is forced downwardly in the +Z direction (e.g., from its initial position at location 16'), extending the distance between finger pad 16 and bone 12 and shortening the distance between finger pad 16 and surface 24.

Due to the inward pressure on finger 10 and the extension of finger pad 16, finger pad 16 will contact surface 24 of device 26B earlier than if finger 10 had not been squeezed. As shown in FIG. 5, for example, finger pad 16 will contact surface 24 earlier than if finger pad 16 were in its original location 16'. Force F on finger 10 may therefore be generated earlier within a user's downward finger stroke than if portions 26A' had not squeezed finger pulp 14 inwardly. This helps gradually reduce the movement of finger 10 in the downward (+Z) direction before bone 12 fully compresses finger pulp 14 (FIG. 6) and thereby reduces potentially fatiguing jarring finger impacts with surface 24.

In the examples of FIGS. 4, 5, and 6, force F is manipulated by squeezing finger pulp 14 and causing finger pad 16 to move outwardly from finger 10 before finger pad 16 contacts input surface 12. If desired, force F can be controlled by incorporating components into device 26A and/or 26B that help slow movement of finger 10 in direction +Z. For example, device 26A and/or 26B may include components that produce a repelling force between device 26A (and finger 10) and device 26B. Forces that attract can also be produced. The repelling (and/or attracting) force may be produced mechanically, electrostatically, ultrasonically, magnetically, etc. The amount of repulsion and/or attraction between devices 26A and 26B may be adjusted dynamically. In some configurations, the amount of force F can be varied so as to exhibit a local peak and valley and thereby create a button clicking sensation.

Figure 7:
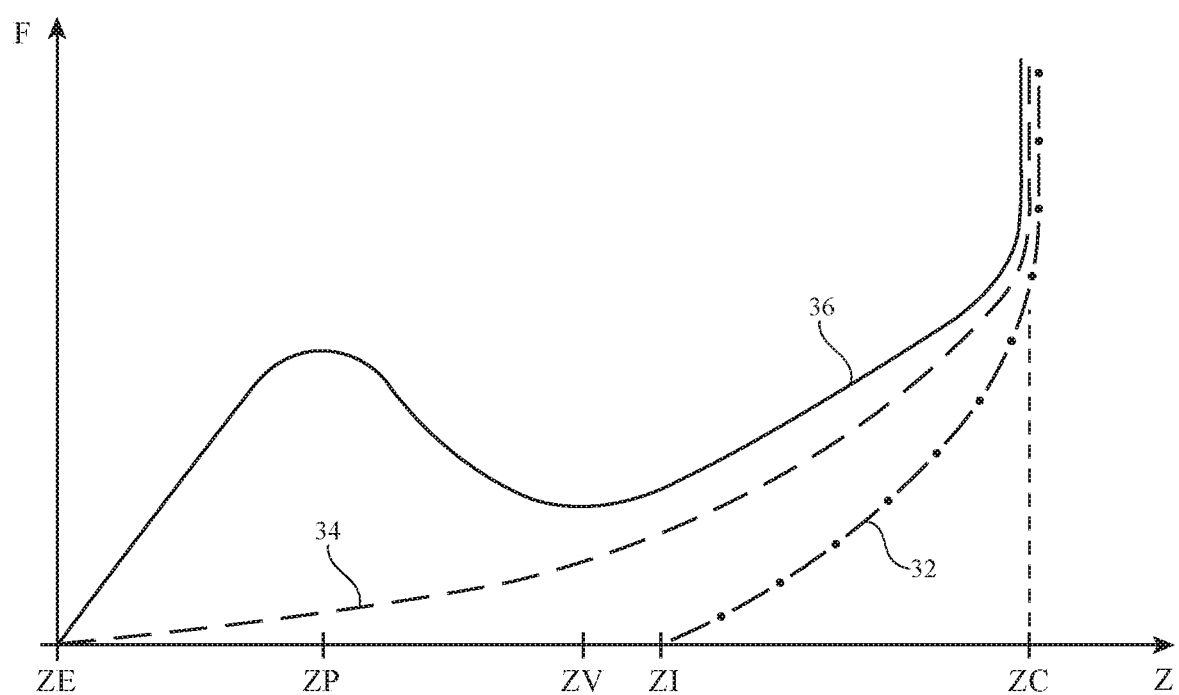
FIG. 7 is a graph showing how the force experienced by a user's finger during a finger press event may be controlled in a system in accordance with an embodiment.

FIG. 7 is a graph in which finger restoring force (upward force F that slows movement of finger 10 in downward direction +Z) has been plotted as a function of finger displacement Z towards input surface 24. Different finger restoring force curves are associated with different system arrangements.

In a first illustrative arrangement (see, e.g., FIGS. 1, 2, and 3), no finger-mounted device is present on finger 10. In this arrangement, which is characterized by force response curve 32, finger pad 16 contacts input surface 24 when bone 12 is at distance ZI its initial starting point. Force F rises smoothly unit pulp 14 is fully compressed against surface 24 by bone 12. At this point, bone 12 is located at a distance ZC along the Z axis and the restoring force F rises sharply (effectively to infinity), preventing further motion of finger 10. The motion of finger 10 is arrested rapidly with this arrangement, so a user's finger will experience a jarring sensation.

In a second illustrative arrangement (see, e.g., FIGS. 4, 5, and 6), finger pulp 14 is squeezed as finger 10 approaches surface 24. Because finger pulp 14 is squeezed, finger pad 16 will extend downwards towards surface 24 away from fingernail 18 and will contact surface 24 early (e.g., at position ZE, rather than position ZI). The early contact between finger pad 16 and surface 24 will extend the distance and time over which restoring force F is applied to finger 10 and will therefore more gradually slow motion of finger 10.

A third illustrative arrangement is associated with curve 36. In this illustrative arrangement, the inward force from the actuators in regions 26A' of device 20A is modulated dynamically, so curve 32 is characterized by a relatively early initial increase (at position ZE), a local peak (at position ZP), and a local valley (at position ZV), before rising sharply at fully compressed finger pulp position ZC. The rapid increase in force F between position ZE and ZP relative to curve 34 may be achieved by increasing inward squeezing of finger pulp 14 during motion of finger 10 from position ZE to position ZP. The rapid decrease in force F between position ZP and position ZV relative to curve 34 may be achieved by decreasing the inward squeezing of finger pulp 14 between position ZP and position ZV (e.g., by moving actuators in portions 26' outwardly). Force F may be increased again (after reaching a local minimum at position ZV) by increasing inward squeezing force using actuators in portions 26' as finger 10 moves from position ZV towards position ZC.

Use of a force profile of the type shown by curve 34 may help reduce fatigue as a user types or otherwise provides touch input to input surface 24 with fingers such as finger 10. Use of a force profile of the type shown by curve 36 may help provide the user with haptic feedback while providing user input. For example, curve 36 may be associated with a clicking sensation of the type that a user may experience when pressing on a physical button. Other force profiles may be applied to finger 10, if desired. The examples of FIG. 7 are merely illustrative.

Figure 8:
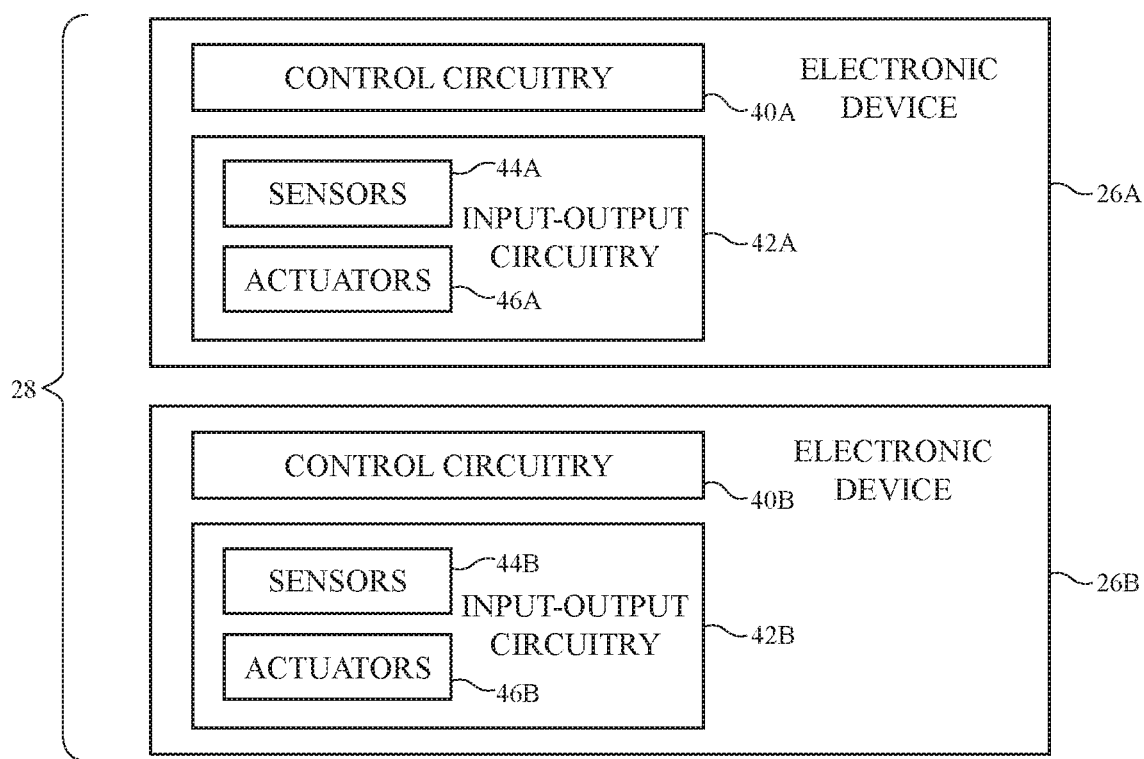
FIG. 8 is schematic diagram of an illustrative system in accordance with an embodiment.

FIG. 8 is a schematic diagram of an illustrative system in which a user may supply user input with one or more fingers 10. As shown in FIG. 8, system 28 may include electronic devices 26A and 26B. In general, system 28 (e.g., devices 26A and/or 26B) may include any suitable electronic equipment. For example, system 28 may include one or more devices such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a remote control, a navigation device, an embedded system such as a system in which equipment is mounted in a kiosk, in an automobile, airplane, or other vehicle, a removable external case for electronic equipment, a strap, a wrist band or head band, a removable cover for a device, a case or bag that has straps or that has other structures to receive and carry electronic equipment and other items, a necklace or arm band, a wallet, sleeve, pocket, or other structure into which electronic equipment or other items may be inserted, part of a chair, sofa, or other seating (e.g., cushions or other seating structures), part of an item of clothing or other wearable item (e.g., a hat, belt, wrist band, headband, sock, glove, shirt, pants, etc.), or equipment that implements the functionality of two or more of these devices.

With one illustrative configuration, which may sometimes be described herein as an example, device 26A is a finger-mounted device (e.g., a finger-mounted pad, a finger-mounted housing with a U-shaped body that grasps the user's finger, a finger-mounted device with other shapes, etc.) and device 26B is a cellular telephone, tablet computer, laptop computer, wristwatch device, or other device with a touch sensitive input surface that is mounted on a device housing or that overlaps a pixel array in a display. In some configurations, only device 26A or only device 26B is used to modify finger forces. In other configurations, components in devices 26A and 26B operate in corporation with each other to modify finger forces.

Devices 26A and 26B may include control circuitry 40A and 40B. Control circuitry 40A and 40B may include storage and processing circuitry for supporting the operation of system 28. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 40A and 40B may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. To support communications between devices 26A and 26B and/or to support communications between equipment in system 28 and external electronic equipment, control circuitry 40A and/or 40B may include antennas, radio-frequency transceiver circuitry, and other wireless communications circuitry and/or wired communications circuitry. Control circuitry 40A and/or 40B may, for example, support bidirectional wireless communications between devices 26A and 26B over a wireless local area network link, a near-field communications link, or other suitable wired or wireless communications link (e.g., a Bluetooth® link, a WiFi® link, a 60 GHz link, etc.).

Devices 26A and/or 26B may include sensors 44A and/or 44B. Sensors 44A and/or 44B may include force sensors, touch sensors such as capacitive touch sensors, capacitive proximity sensors, optical sensors (e.g., ambient light sensors that detect light and/or optical proximity sensors that emit light and detect reflected light), image sensors, sensors for detecting position, orientation, and/or motion (e.g., accelerometers, magnetic sensors such as compass sensors, gyroscopes, inertial measurement units that contain some or all of these sensors), muscle activity sensors (EMG) for detecting finger actions, and/or other sensors. In some arrangements, devices 26A and/or 26B may use sensors 44A and/or 44B and/or other devices to gather user input (e.g., buttons may be used to gather button press input, touch sensors overlapping displays can be used for gathering user input, touch pads may be used in gathering touch input, microphones may be used for gathering audio input, accelerometers in device 26A and/or 26B may be used in monitoring when a finger contacts an input surface and may therefore be used to gather finger press input, etc.).

Devices 26A and/or 26B may include output devices such as actuators 46A and/or 46B. Actuators 46A and/or 46B may include electromagnetic actuators, motors, piezoelectric actuators, electroactive polymer actuators, vibrators, linear actuators, rotational actuators, actuators that bend bendable members, and may include output devices that create and/or control repulsive and/or attractive forces between devices 26A and/or 26B (e.g., components for creating electrostatic repulsion and/or attraction such as electrodes, components for producing ultrasonic output such as ultrasonic transducers, components for producing magnetic interactions such as electromagnets for producing direct-current and/or alternating-current magnetic fields, permanent magnets, magnetic materials such as iron or ferrite, and/or other circuitry for producing repulsive and/or attractive forces between devices 26A and/or 26B). In some situations, actuators 46A and/or 46B or other devices for creating forces in devices 26A and/or 26N may be used in squeezing finger 10 and/or otherwise directly interacting with finger pulp 12. In other situations, these components may be used to interact with each other (e.g., by creating a dynamically adjustable electromagnetic repulsion and/or attraction force between device 26A and 26B using electromagnets in device 26A and/or 26B). Configurations for system 28 may also be used in which finger-pulp-squeezing actuators are used in conjunction with components that create repulsive and/or attractive forces with finger 10 and/or devices 26A and/or 26B (e.g., based on electrostatic effects, ultrasonic effects, magnetic effects, and/or other effects).

Figure 9:
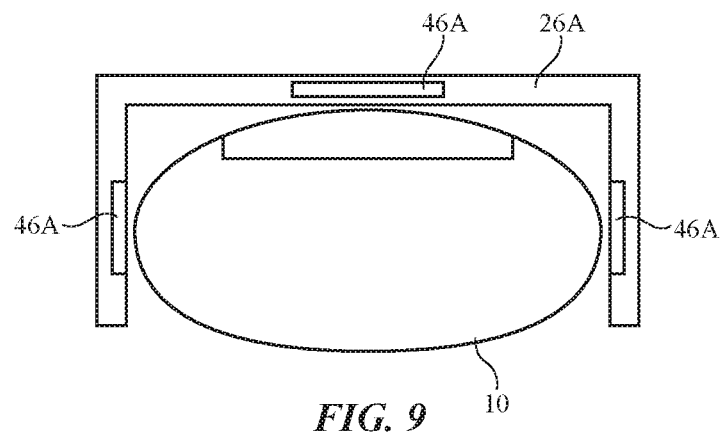
FIGS. 9, 10, and 11 are diagrams of illustrative finger-mounted devices for a system in accordance with an embodiment.
Figure 10:
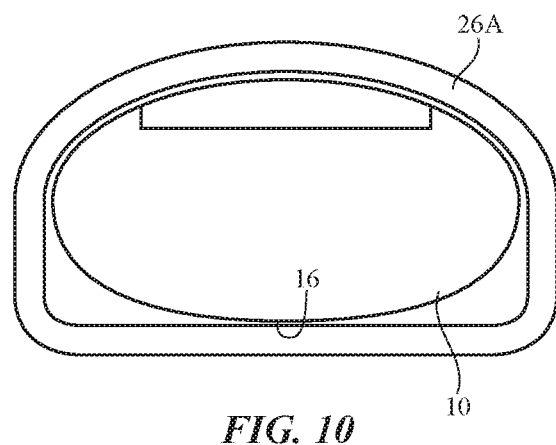
Figure 11:
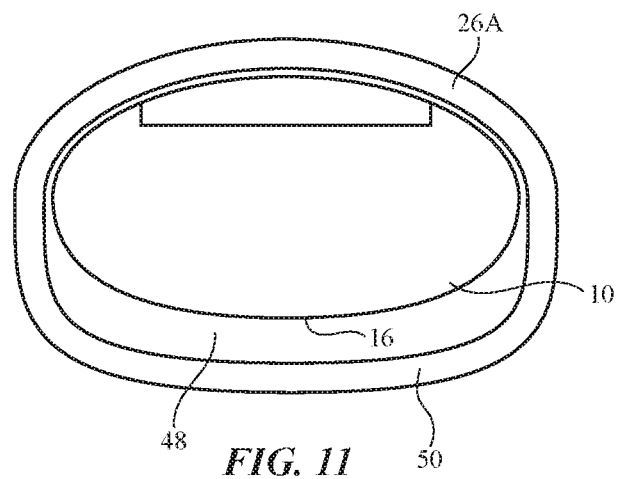

FIGS. 9, 10, and 11 show illustrative finger-mounted devices. As illustrated in FIG. 9, device 26A may include components such as actuators 46A for squeezing finger 10, for interacting with corresponding components in device 46B to create repulsive and/or attractive forces, etc. In the example of FIG. 9, device 26A has a U-shaped housing that fits over the top of a user's finger. In the example of FIG. 10, device 26A has a tubular housing that is received over the tip of a user's finger 10 and that touches finger pad 16. FIG. 11 shows how device 26A may have a housing that is configured to create an air gap such as air gap 48 between finger pad 16 and lower portion 50 of the housing. Dome switches, touch sensors, accelerometers, and/or other sensors and input components may be mounted on a lower portion of the housing of device 26A (e.g., under finger pad 16) and/or elsewhere in device 26A.

Figure 12:
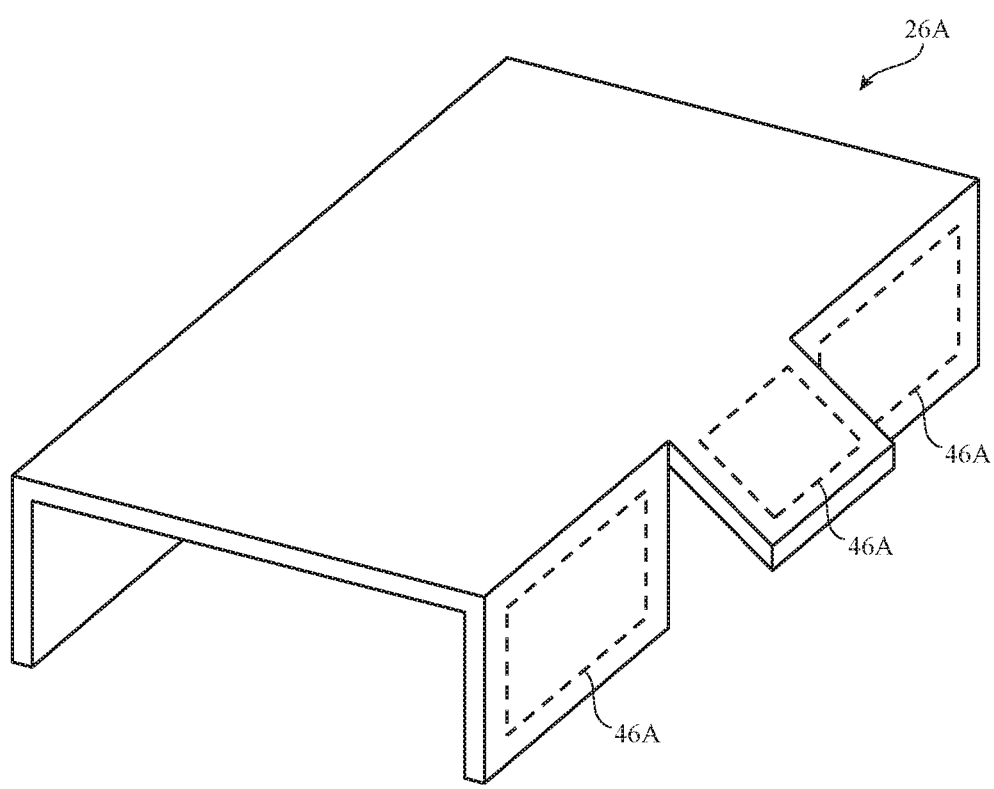
FIG. 12 is a perspective view of an illustrative finger-mounted device with locally adjustable side actuators in accordance with an embodiment.

If desired, actuators 46A along the sides of device 26A and/or in other portions of device 26A may be individually adjusted. As shown in FIG. 12, for example, side portion 52 of device 26A may have multiple individually adjustable flap actuators 46A for selectively applying force to different side surfaces of finger 10 along the length of finger 10.

Figure 13:
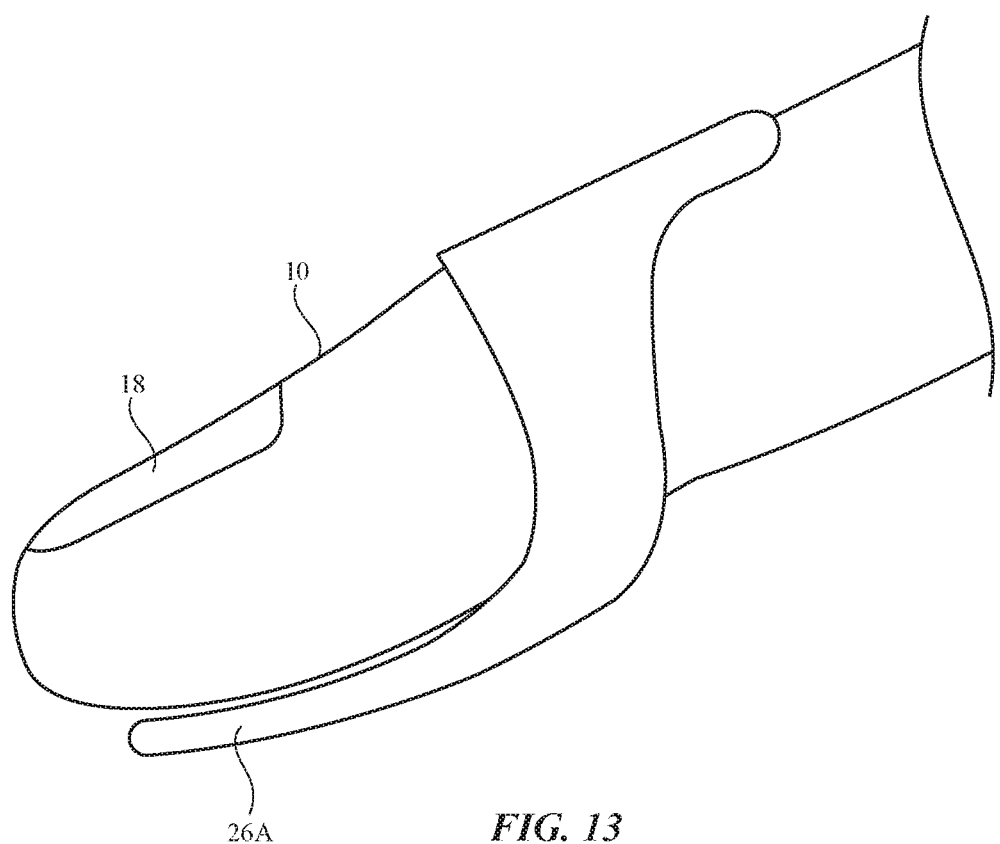
FIG. 13 is a side view of an illustrative finger-mounted device in accordance with an embodiment.

FIG. 13 shows how the housing of device 26A may wrap under the tip of finger 10 while leaving fingernail 18 exposed. Gloves, sets of fingertip-mounted devices that are joined by flexible attachment structures (e.g., wires, flexible printed circuits, fabric, etc.), and/or other devices that can be worn on or adjacent to a user's fingers or other body parts may also be used in forming device(s) such as device 26A.

Figure 14:
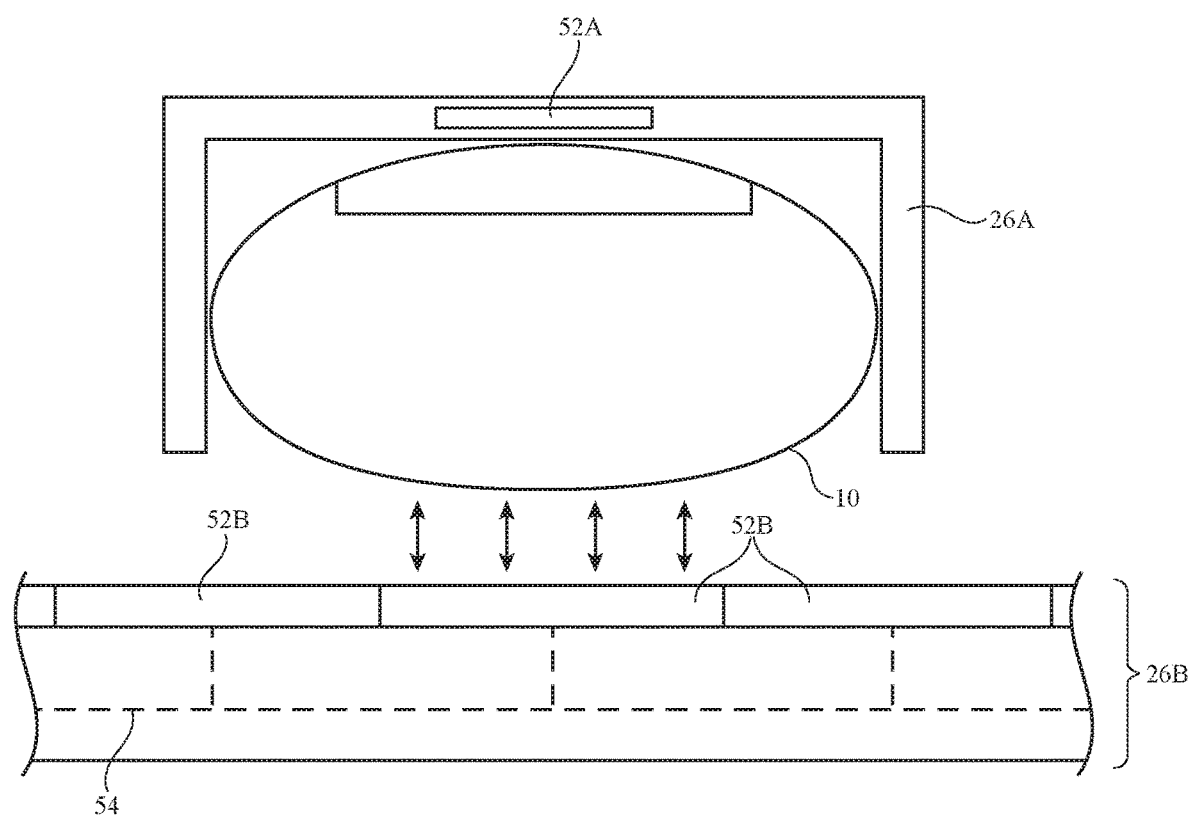
FIG. 14 is a diagram of a user's finger with an optional finger-mounted device and an associated electronic device in a system in accordance with an embodiment.

If desired, devices 26A and/or 26B may produce signals that create attraction and/or repulsion between device 26A (and finger 10) and device 26B. As shown in FIG. 14, device 26B may have an array of force-modifying components such as components 52B and device 26A may have one or more force-modifying components such as component 52A. Control circuitry 40A may control the operation of component 52A and control circuitry 40B may control the operation of components 52B (e.g., using control signal paths 54). In some arrangements, the operation of control circuitry 40A and the operation of control circuitry 40B may be coordinated (e.g., using wired or wireless communications).

With one illustrative configuration, components 52A and 52B may create attractive and/or repulsive forces using electrostatic attraction or repulsion. For example, components 52B may include electrodes that are supplied with electrostatic charge using paths 54. As finger 10 is approaching input surface 24, electrostatic repulsion of finger 10 may be increased to help soften the impact between finger 10 and surface 24. Electrostatic repulsion may also be used to create repulsion between components 52B and component 52A and thereby apply a repulsive force indirectly to finger 10. The electrostatic repulsion (and/or attraction) electrodes of components 52B may, if desired, be indium tin oxide electrodes or other transparent conductive electrodes that also serve as capacitive electrodes in a two-dimensional capacitive touch sensor array overlapping a display.

In another illustrative configuration, components 52A and/or 52B are ultrasonic transducers that creation ultrasonic sound and/or ultrasonic vibrations of device 26A and/or surface 24, thereby adjusting the sensation of contact between finger pad 16 and surface 24.

In some configurations, components 52A and/or 52B are electromagnets (e.g., coils) that produce direct-current magnetic fields. A direct-current magnetic field may, for example, repel a permanent magnet (e.g., when component 52A is a permanent magnet) or may attract a magnetic material such as iron (e.g., when component 52A is a magnetic material). Alternating-current electromagnetic fields may be produced by components 52B (e.g., when components 52B include coils and/or antennas) and may induce eddy currents in component 52A (e.g., when component 52A is a conductive metal plate). These eddy currents may interact with the applied electromagnetic fields and may create repulsive force between components 52B and 52A.

Other arrangements may rely on other forces (e.g., mechanical forces such as haptic output produced by actuators 46A and/or 46B that create sensations of attraction and/or repulsion between devices 26A and 26B, lateral squeezing forces from actuators 46A that extend finger pad 16 and thereby modify force F, etc.) may be used in modifying finger sensations as a user provides key press input with one or more fingers such as finger 10.

Control circuitry 40A and/or 40B may adjust these force-producing components based on sensor input from sensors 44A and/or 44B. For example, repulsive forces between devices 26A and 26B may be generated in response to detection with sensors 44A and/or 44B (e.g., a proximity sensor, etc.) that devices 26A and 26B are less than a predetermined threshold distance from each other. In response to detecting that device 26A has moved within a given distance of input surface 24, for example, device 26B may create an electromagnetic repulsive force, an ultrasonic force, an electrostatic force, etc. and/or device 26A may use one or more actuators 46A to squeeze finger 10 and thereby extend pad 16 away from nail 18. The sensor that detects proximity between device 26A (and finger 10) and device 26B may be located in device 26A and/or in device 26B. In situations in which the repulsive force is generated by a different device than the device containing the sensor, wireless communications can be used to signal the non-sensor-containing device to use its components to generate the repulsive force.

Figure 15:
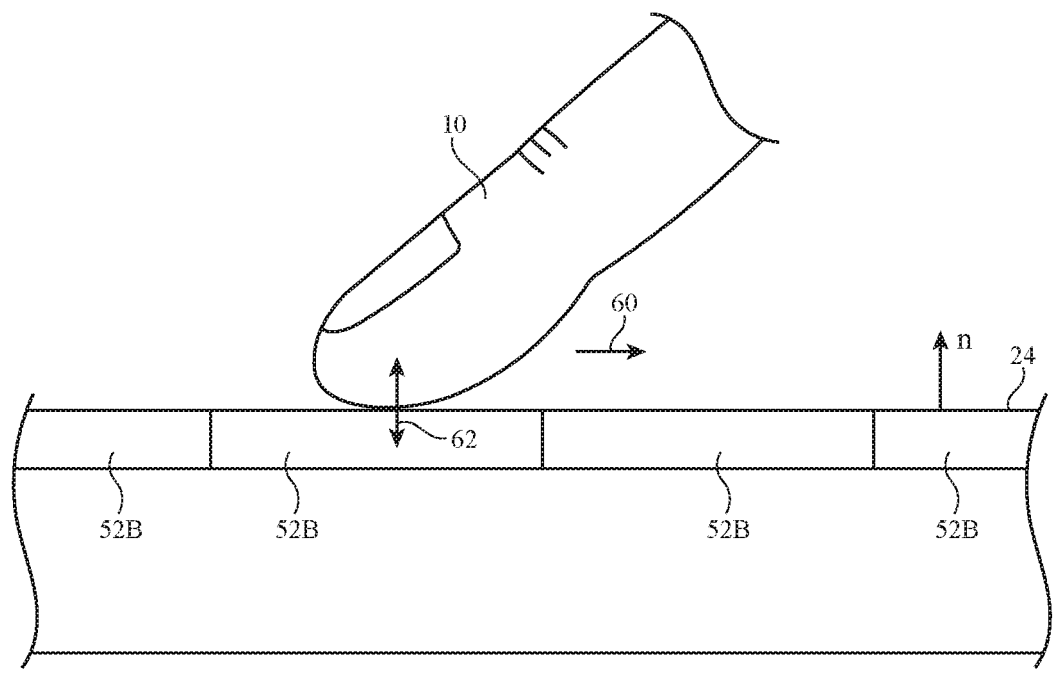
FIG. 15 is a side view of a user's finger during interactions with an input surface of an electronic device in a system in accordance with an embodiment.
Figure 16:
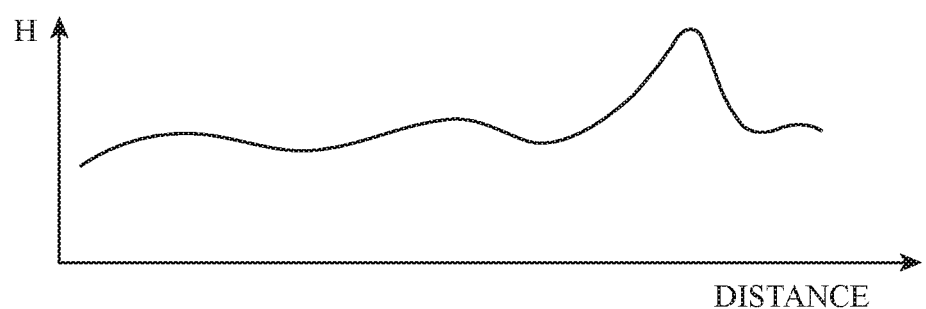
FIG. 16 is a graph showing how the user's finger of FIG. 15 may be displaced vertically as the user's finger moves laterally across the input surface of the electronic device of FIG. 15 in accordance with an embodiment.

Finger sensations may also be modified during lateral movement of finger 10. Consider, as an example, the scenario of FIG. 15 in which a user is moving finger 10 laterally in direction 60 while components 52B (e.g., actuators 46B) move in directions 62 parallel to surface normal n of input surface 24. By adjusting the displacement of each of components 52B in normal direction n as finger 10 is moved in direction 60, the height H of finger pad 16 may be adjusted as shown in FIG. 16 (e.g., to create a sensation of texture, surface height irregularities, etc.). For example, a user may sense that finger 10 is moving over a ridge or other dynamically created surface texture features on surface 24. If desired, device 26A may be worn on finger 10 to accentuate or create forces and displacement normal to surface 24 and/or to otherwise modify the lateral and/or normal forces impressed upon finger 10 by device 26B.

The foregoing is merely illustrative and various modifications can be made to the described embodiments. The foregoing embodiments may be implemented individually or in any combination.

What is claimed is:
1. A finger-mounted device configured to be worn on a finger of a user as the finger is moved towards a surface, the finger having a fingertip with a fingernail and a finger pad, the finger-mounted device comprising:
a body configured to be coupled to the finger;
control circuitry; and
an actuator coupled to the body that is configured to squeeze the finger and cause the finger pad to move away from the fingernail in response to control signals from the control circuitry.

2. The finger-mounted device defined in claim 1 further comprising a proximity sensor configured to detect proximity of the finger to the surface, wherein the actuator in movable in an inward direction to press against the finger and an opposing outward direction and wherein the control circuitry is configured to:
move the actuator in the inward direction to squeeze the finger in response to a signal from the proximity sensor; and
as the finger moves towards the surface after the actuator moves in the inward direction, move the actuator in the outward direction.

3. The finger-mounted device defined in claim 2 wherein the body is configured to be coupled to the fingertip, covering the fingernail of that fingertip and leaving the finger pad of that fingertip exposed.

4. The finger-mounted device defined in claim 2 wherein the surface comprises an input surface associated with a touch sensor that overlaps a display in an electronic device and wherein the proximity sensor comprises:
a light-emitter configured to emit light; and
a light detector that detects the light.

5. The finger-mounted device defined in claim 2 wherein the surface comprises an input surface associated with a touch sensor that overlaps a display in an electronic device and wherein the proximity sensor comprises a capacitive proximity sensor.

6. A system, comprising:
a touch sensor that forms an input surface configured to gather user finger press input from a finger of a user;
a sensor configured to detect a position of the finger with respect to the input surface;
control circuitry configured to generate a control signal in response to output from the sensor;
a component overlapped by the touch sensor and configured to generate a force in response to the control signal that is configured to interact with the finger when the user presses the input surface; and
a finger-mounted device in communication with the control circuitry, wherein the finger-mounted device applies force to the finger of the user and wherein the finger-mounted device leaves a fingernail of the user exposed.

7. The system defined in claim 6 wherein the force is a repulsive force configured to repel the finger from the input surface.

8. The system defined in claim 6 wherein the force is an attractive force configured to attract the finger towards the input surface.

9. The system defined in claim 6 wherein the force is a force selected from the group consisting of: an electrostatic force and a magnetic force and wherein the control circuitry is configured to generate the force by applying the control signal to the component.

10. The system defined in claim 6 wherein the component comprises an electromagnet and wherein the finger is coupled to a finger-mounted device with a permanent magnet.

11. The system defined in claim 6 wherein the component comprises an ultrasonic transducer.

12. The system defined in claim 6 further comprising an array of actuators overlapping the input surface, wherein the control circuitry is configured to use the array of actuators to create dynamically adjustable surface height variations on the input surface as the finger is moved laterally across the input surface.

13. An electronic device operable with a finger-mounted device worn on a finger of a user, wherein the finger has a fingertip with a fingernail, a finger pad, and side portions between the fingernail and the finger pad, wherein the finger-mounted device comprises a body that is coupled to the fingertip, covers the fingernail and side portions of that fingertip, and leaves the finger pad of that fingertip exposed, and wherein the body includes a component, the electronic device, the electronic device comprising:
a display;
a two-dimensional touch sensor overlapping the display that forms a touch sensitive input surface configured to gather finger press input from the finger;
an array of electrical components overlapping the display; and
control circuitry configured to use the array of electrical components to create a force that interacts with the finger-mounted device, and wherein the control circuitry is configured to use the array of electrical components to create a force that interacts with the component in the finger-mounted device and that applies feedback to the side portions of the finger.

14. The electronic device defined in claim 13 further comprising a proximity sensor, wherein the control circuitry is configured to adjust the force interacting with the finger-mounted device using the array of electrical components in response to output from the proximity sensor.

15. The electronic device defined in claim 13 wherein the array of electrical components comprises an array of electromagnets.

16. The electronic device defined in claim 13 wherein the array of electrical components comprises an array of electrodes and wherein the control circuitry is configured to supply the electrodes signals that create an electrostatic force between the array of electrodes and the finger-mounted device.

17. The electronic device defined in claim 13 wherein the finger-mounted device comprises metal and wherein the array of electrical components is configured to induce eddy currents in the metal that create a force between the metal and the array of electrical components.

18. The electronic device defined in claim 13 wherein the finger-mounted device comprises a permanent magnet and wherein the array of electrical components comprises an array of coils configured to produce magnetic fields that interact with the permanent magnet.

* * * * *

UNITED STATES PATENT AND TRADEMARK OFFICE
CERTIFICATE OF CORRECTION

PATENT NO. : 10,712,931 B2  
APPLICATION NO. : 16/038544  
DATED : July 14, 2020  
INVENTOR(S) : Paul X. Wang Page 1 of 1

It is certified that error appears in the above-identified patent and that said Letters Patent is hereby corrected as shown below:

In the Claims

Column 9, Line 11, in Claim 2, "the actuator in" should read -- the actuator is --

Signed and Sealed this  
Ninth Day of February, 2021

Drew Hirshfeld  
*Performing the Functions and Duties of the*  
*Under Secretary of Commerce for Intellectual Property and*  
*Director of the United States Patent and Trademark Office*